United States Patent
Fujinaga et al.

Patent Number: 5,415,698
Date of Patent: May 16, 1995

[54] METHOD FOR CLEANING SEMICONDUCTOR WAFERS

[75] Inventors: Sugao Fujinaga; Naomi Arita, both of Hirakata; Yoshitaka Dansui, Neyagawa, all of Japan

[73] Assignee: Matsushita Electric Industrial Co., Ltd., Osaka, Japan

[21] Appl. No.: 84,421

[22] Filed: Jun. 29, 1993

[30] Foreign Application Priority Data

Jun. 29, 1992 [JP] Japan ................................ 4-170766

[51] Int. Cl.⁶ ............................................. B08B 3/04
[52] U.S. Cl. ................................... 134/34; 134/25.1; 134/25.4; 134/3
[58] Field of Search ................... 134/34, 18, 2, 3, 25.1, 134/25.4

[56] References Cited

U.S. PATENT DOCUMENTS 4,375,992  3/1983  Stevens et al. ..................... 134/34
5,071,488  12/1991  Takayama et al. .................. 134/34

*Primary Examiner*—Paul Lieberman
*Assistant Examiner*—Lorna M. Douyon
*Attorney, Agent, or Firm*—Ratner & Prestia

[57] ABSTRACT

A method for cleaning a substrate of the present invention, in which a plurality of substrates are placed substantially parallel with each other are dipped into a cleaning solution to remove particles adhering to each of the substrates, includes the step of dipping the substrates into the cleaning solution at a speed (V) through a surface of the cleaning solution, wherein the speed (V) for dipping the substrates into the cleaning solution, a minimum distance (l) among distances between the substrates, a length (L) of the substrates measured in a dip direction thereof, and a speed (v) at which the particles are transferred along the surface of the cleaning solution in a vertical direction with respect to back faces of the substrates satisfy the expression: $lV \geq vL$.

7 Claims, 6 Drawing Sheets

METHOD FOR CLEANING SEMICONDUCTOR WAFERS

BACKGROUND OF THE INVENTION

1. Field of the Invention

The present invention relates to a method for cleaning a substrate.

2. Description of the Related Art

Figure 8:
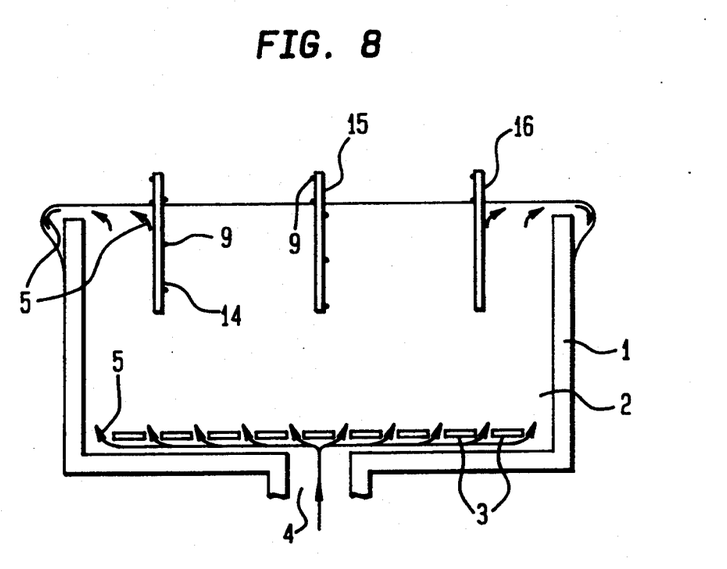
FIG. 8 is a diagram illustrating a conventional method for cleaning a substrate.

Referring to FIG. 8, a conventional method for cleaning a semiconductor substrate will be described.

The conventional method for cleaning a semiconductor substrate (hereinafter, referred to as a substrates) includes the step of dipping a plurality of substrates 14, 15, and 16 into a cleaning solution 2. At this time, the plurality of substrates 14, 15, and 16 are dipped into the cleaning solution 2 through the surface thereof under the condition that the substrates 14, 15, and 16 are placed substantially parallel with each other. The cleaning solution 2 is accommodated in a cleaning tank 1. A supply port 4 is provided on the bottom of the cleaning tank 1. The cleaning solution 2 is supplied to the cleaning tank 1 through the supply port 4. In a lower portion of the cleaning tank 1, a rectifying plate 3 is provided. Because of the rectifying plate 3, a flow 5 of the cleaning solution 2 maintains a laminar flow. The top of the cleaning tank 1 is open, and the cleaning solution overflows the cleaning tank 1.

A plurality of substrates 14, 15, and 16 are arranged in a wafer carrier (not shown) and dipped into the cleaning solution 2 together with the wafer carrier. A generally used wafer carrier has a plurality of grooves at a pitch of 4.76 mm for supporting the respective plurality of substrates. Considering the thickness (0.65 mm) of each substrate, a distance (l) between the substrates arranged in the wafer carrier becomes 4.11 mm. The distance (l) is in accordance with the standard SEMI which was determined about twenty years ago. The standard SEMI has not changed since then. When a plurality of substrates are dipped into the cleaning solution 2 under the condition that many substrates are placed at a small distance from each other, the efficiency of the cleaning step can be increased. In addition, the decrease in the amount of a cleaning solution to be used, due to the miniaturization of the cleaning tank 1, lowers the cost for the cleaning step.

There is a tendency that the diameter of a substrate increases. Namely, a length (L) of a substrate measured in the dip direction becomes larger. On the other hand, a dip speed (V) has been tried to be made high so as to improve a throughput; however, a maximum speed is about 200 mm/sec. because of the restriction of members of a driving portion and a control system. The high-speed is only for the purpose of improving the throughput.

In the conventional method for cleaning, as shown in FIG. 8, the first substrate 14, the second substrate 15, and the third substrate 16 are dipped into the cleaning solution 2 in the vertical direction with respect to the surface of the cleaning solution 2 under the condition that a number of particles 9 adhere to the back face of each substrate. Most of the particles 9 adhering to the first, second, and third substrates 14, 15, and 16 which are thus soaked depart therefrom into the cleaning solution 2, and are removed away from the cleaning tank 1 through the flow 5 of the cleaning solution 2.

However, in the conventional technique, after the particles 9 adhering to the back face of the third substrate 16 depart therefrom, part of the departed particles 9 readhere to the front face of an adjacent substrate 15.

The degree of contamination on the back face of a substrate has been increased along with the automatization of an apparatus for producing a semiconductor device. This is because the back face of the substrate is likely to come into contact with a supporting stage and the like, while the substrate is being conveyed or various kinds of treatments are given to the substrate. In addition, the number of production steps is increased as the structure of the substrate becomes more complicated. Thus, the substrate has more chances to come into contact with the supporting stage and the like.

In the conventional technique, the following methods have been used for the purpose of protecting the back face of the substrate from the above-mentioned contamination: Preventing particles from adhering to the back face of the substrate as much as possible; and removing the particles adhering to the back face of the substrate as much as possible.

In the former method, while the substrate is being conveyed or is being treated, the back face of the substrate is prevented from coming into contact with other mechanical elements as much as possible or the contact area between the back face of the substrate and the other mechanical elements is made as small as possible. This method has a problem of the limit to decreasing the contact area.

In the latter method, for example, the particles on the back face of the substrate are removed with a scraper. However, in this method, the number of the production steps increases. Because of this, it is difficult to decrease the number of the particles adhering to the back face of the substrate.

The readhesion of the particles 9 during the cleaning step decreases the production yield of semiconductor devices which are formed on the front face of the substrate. In particular, even particles in the order of a submicron decreases the production yield of a minute semiconductor device. Thus, the readhesion of the particles 9 during the cleaning step causes a serious problem for the improvement of the production yield of a semiconductor device. Even under these circumstances, the mechanism of the readhesion of the particles 9 is not made clear, so that this problem has not sufficiently been overcome.

SUMMARY OF THE INVENTION

The method for cleaning a substrate of the present invention, in which a plurality of substrates placed substantially parallel with each other are dipped into a cleaning solution to remove particles adhering to each of the substrates, includes the step of dipping the substrates into the cleaning solution at a speed (V) through a surface of the cleaning solution, wherein the speed (V) for dipping the substrates into the cleaning solution, a minimum distance (l) among distances between the substrates, a length (L) of the substrates measured in a dip direction thereof, and a speed (v) at which the particles transfer along the surface of the cleaning solution in a vertical direction with respect to back faces of the substrates satisfy the expression: $lV \geq vL$.

In one embodiment of the present invention, the plurality of substrates are dipped into the cleaning solution so that a dip direction thereof and the surface of the cleaning solution forms a substantially right angle.

In another embodiment of the present invention, a main component of the particles is silicon.

In another embodiment of the present invention, the cleaning solution is a mixture containing sulfuric acid and aqueous hydrogen peroxide.

In another embodiment of the present invention, the cleaning solution is accommodated in a cleaning tank having an opening on a bottom thereof, the cleaning solution is supplied to the cleaning tank through the opening, and the substrates are dipped into the cleaning solution while the cleaning solution overflows the cleaning tank.

According to another aspect of the present invention, a method for cleaning a substrate in which a plurality of substrates are dipped into a cleaning solution to remove particles adhering to each of the substrates is provided, wherein the substrates are separately dipped into the cleaning solution so that two or more substrates among the plurality of substrates are not simultaneously exposed on a surface of the cleaning solution.

In one embodiment of the present invention, the cleaning solution is accommodated in a cleaning tank having an opening on a bottom thereof, the cleaning solution is supplied to the cleaning tank through the opening, and the substrates are dipped into the cleaning solution while the cleaning solution overflows the cleaning tank.

As a result of our experiments, the following was found:

Assuming that the speed (V) for dipping the substrates into the cleaning solution is constant, the number of transferred particles depends on the distance (l) between the substrates and the length (L) of the substrates in the dip direction thereof. As the ratio of the distance (l) between the substrates to the length (L) of the substrates in the dip direction is larger, the number of transferred particles is smaller. As the speed (V) for dipping the substrates into the cleaning solution is higher, the number of transferred particles is smaller. Thus, in order to prevent the transfer of particles, larger distance (l), higher dip speed (V), and smaller length (L) are required. According to the present invention, the substrates are cleaned under the condition that these three parameters are set so that the transfer of particles is not caused.

According to the method of the present invention, when the expression: $lV \geq vL$ is satisfied, all of the substrates can be completely submerged in the cleaning solution before the particles departing from a substrate reach an adjacent substrate. Thus, the particles departing from a substrate can be prevented from readhering to an adjacent substrate.

In addition, according to another method of the present invention, substrates are separately dipped into the cleaning solution so that two or more substrates are not simultaneously exposed on the surface of the cleaning solution. Because of this, the particles which depart from the nth substrate have been removed from the cleaning solution to the outside by the time when the (n+1)th substrate is dipped into the cleaning solution. Thus, the particles departing the nth substrate can be prevented from readhering to the (n+1)th and the subsequent substrates.

Thus, the invention described herein makes possible the advantage of providing a method for cleaning a substrate in which particles dispersed from a substrate can be prevented from readhering to another substrate.

This and other advantages of the present invention will become apparent to those skilled in the art upon reading and understanding the following detailed description with reference to the accompanying figures.

DESCRIPTION OF THE PREFERRED EMBODIMENTS

Figure 1A:
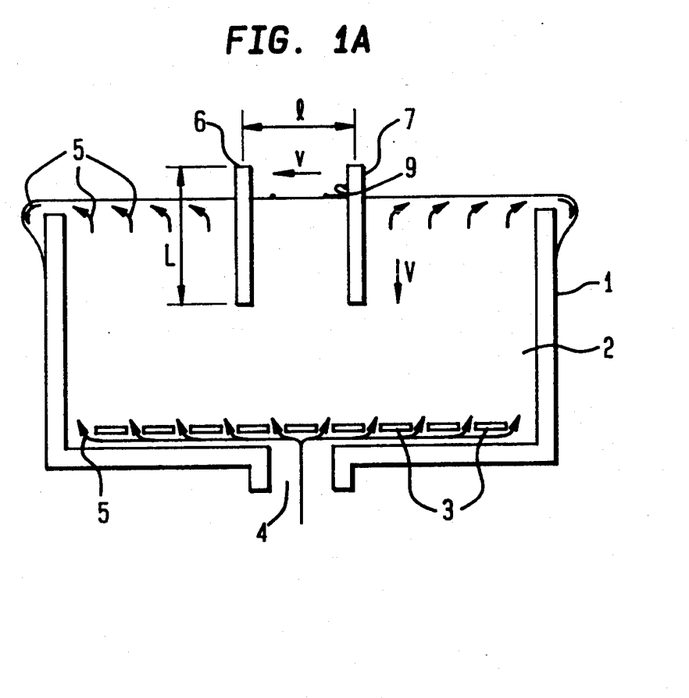
FIGS. 1A and 1B are diagrams showing a device for clarifying the movement of particles during the step for cleaning a substrate.
Figure 1B:
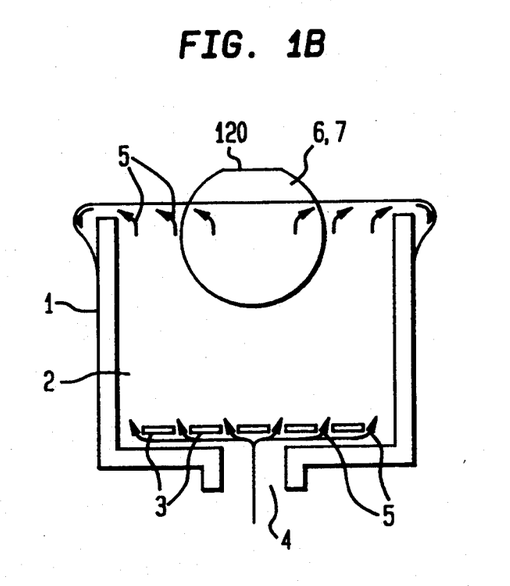

The inventors of the present invention conducted the following experiments for the purpose of clarifying the mechanism of readhesion (transfer) phenomenon of particles during a wet cleaning step. FIGS. 1A and 1B are diagrams schematically showing a device used in the experiments. As shown in FIG. 1A, first and second semiconductor substrates 6 and 7 were dipped into a mixture (cleaning solution) 2 containing sulfuric acid and aqueous hydrogen peroxide. At this time, the substrates 6 and 7 were dipped into the cleaning solution 2 through the surface thereof under the condition that the substrates 6 and 7 were placed substantially in parallel with each other.

Before cleaning, the front face of the first substrate 6 was not contaminated, but the back face of the substrate 7 was contaminated with particles 9. The substrates 6 and 7 were dipped into the cleaning solution 2 at a dip speed (V) under the conditions that the front face of the substrate 6 faced the back face of the substrate 7 and an orifla (orientation flat) position 120 of the respective substrates 6 and 7 was placed upward (FIG. 1B).

Si was exposed on the back face of the substrate 7, and $SiO_2$ was exposed on the front face of the substrate 6. Namely, the substrate 1 was an ordinary Si substrate on the front face of which an $SiO_2$ film was formed. Before the cleaning step, a number of particles were made to adhere to the back face of the substrate 7 by using a vacuum pincette or a stage for baking, to which a number of particles adhered.

The cleaning solution 2 was accommodated in a cleaning tank 1. A supply port 4 was provided on the bottom of the cleaning tank 1. During the cleaning step, the cleaning solution 2 was continuously supplied to the cleaning tank 1 through the supply port 4. The top of the cleaning tank 1 was open, and the cleaning solution 2 overflew the cleaning tank 1. In a lower portion of the cleaning tank 1, a rectifying plate 3 was provided. Because of the rectifying plate 3, a flow 5 of the cleaning solution 2 maintained a laminar flow.

Before the substrates 6 and 7 were dipped into the cleaning solution 2, the substrates 6 and 7 were inserted in a wafer carrier (not shown). The wafer carrier had a plurality of grooves which were disposed at a distance of 4.76 mm from each other and supported the substrates. After that, the substrates 6 and 7 were dipped into the cleaning solution 2 together with the wafer carrier at a predetermined speed. The experiments were conducted in the following two cases: Substrates 6 and 7 were inserted in the wafer carrier so that the distance between the substrates 6 and 7 was 4.11 mm; and substrates 6 and 7 were inserted in the wafer carrier so that the distance between the substrates 6 and 7 was 8.87 mm. Here, the substrates 6 and 7 had a diameter of 150 mm$\phi$.

The contamination of the particles 9 on the front face of the substrate 6 and the back face of the substrate 7 was evaluated by using a surface analyzer of a laser beam scattering type. According to the surface analyzer, a peripheral region of the substrate (a region with a width of 10 mm) was not analyzed, and the number of particles with a particle size of, for example, 0.3 $\mu$m or more could be counted up to 9999. The position of the counted particles was displayed two-dimensionally (map display). The number of the particles were counted from the center of the substrate to the periphery thereof. When the total number of the counted particles exceeded 9999, the position of the further counted particles was not displayed any more.

Figure 2A:
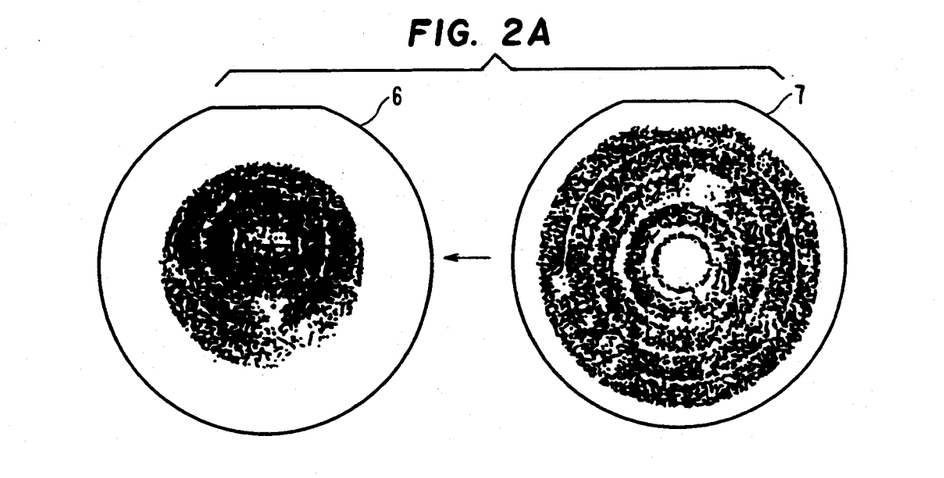
FIG. 2A shows the transfer of particles in the case where a stage for baking is used as a contamination source.
Figure 2B:
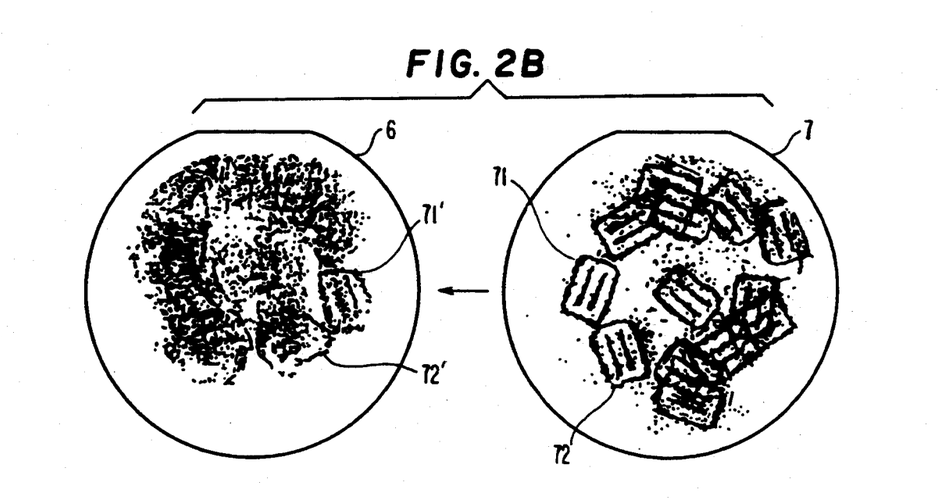
FIG. 2B shows the transfer of particles in the case where a vacuum pincette is used as a contamination source.

FIG. 2A shows the transfer of particles in the case where the stage for baking was used as a contamination source. FIG. 2B shows the transfer of particles in the case where the vacuum pincette was used as a contamination source. Both of the diagrams of FIGS. 2A and 2B are map displays obtained by using the above-mentioned surface analyzer.

As shown in FIG. 2A, the particle transfer pattern on the front face of the substrate 6 after cleaning was a concentric circle in the same way as the particle contamination pattern on the back face of the substrate 7 before cleaning. The center of the concentric circle of the transfer pattern was shifted in the direction opposite to the dip direction by a certain distance from the center of the concentric circle of the contamination pattern.

As shown in FIG. 2B, on the back face of the substrate 7 before cleaning, first contamination patterns 71 and second contamination patterns 72, which were caused by holding the substrate 7 with the vacuum pincette, were displayed. As is understood from FIG. 2B, first transfer patterns 71' and second transfer patterns 72' corresponded to the first and second contamination patterns 71 and 72, respectively. The position of each transfer pattern was shifted from the position of each contamination pattern in the direction opposite to the dip direction; however, no shift was observed in the vertical direction with respect to the dip direction. The transfer patterns 71' and 72' form a mirror image of the contamination patterns 71 and 72.

From the above-mentioned results, it can be presumed that the particles adhering to the back face of the substrate 7 were transferred to the front face of the substrate 6 while substantially maintaining the positional relationship between the particles.

Figure 3:
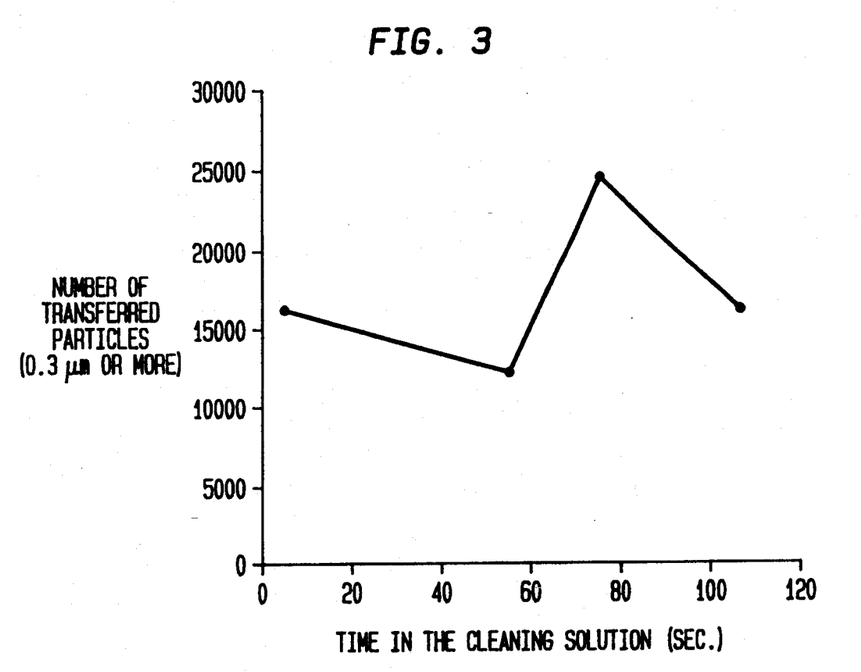
FIG. 3 is a graph showing the relationship between the time in the cleaning solution and the number of transferred particles.

FIG. 3 is a graph showing the relationship between the time in the cleaning solution and the number of transferred particles. After being completely submerged in the cleaning solution, the substrate was retained in the cleaning solution for a certain period of time. The number of transferred particles were observed at each time (i.e., 5, 55, 75, and 105 sec.). It is understood from FIG. 3 that the number of transferred particles did not depend on the time. This means that the transfer of the particles did not occur in the cleaning solution, but occurred on the region were the surface of the cleaning solution was in contact with the substrate while the substrate was being dipped into the cleaning solution.

From the above-mentioned results, the inventors of the present invention considered that each particle on the back face of the substrate 7 was moved to the front face of the substrate 6 along the surface of the cleaning solution 2 at a certain speed (v), thereby readhering to the front face of the substrate 6. Based on this idea, the inventors of the present invention came up with the following methods for preventing the readhesion of the particles 9: Before some particles which firstly departed from a substrate were transferred along the surface of the cleaning solution 2 to reach an adjacent substrate, the adjacent substrate was completely submerged in the cleaning solution; and until the particles which lastly departed from a substrate overflew the cleaning tank 1 along the surface of the cleaning solution 2, another substrate was not dipped into the cleaning solution 2.

Figure 4A:
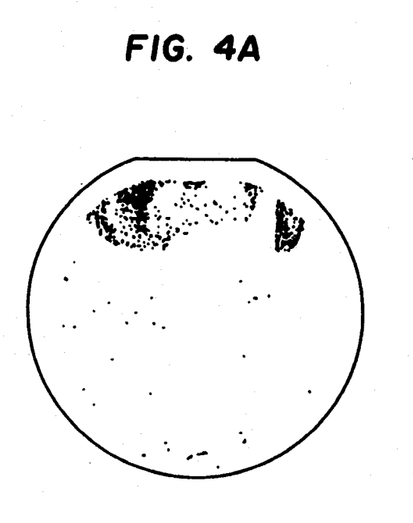
FIG. 4A shows the transfer of particles in the case where the cleaning step is conducted under the condition that a distance between substrates is 8.87 mm.
Figure 4B:
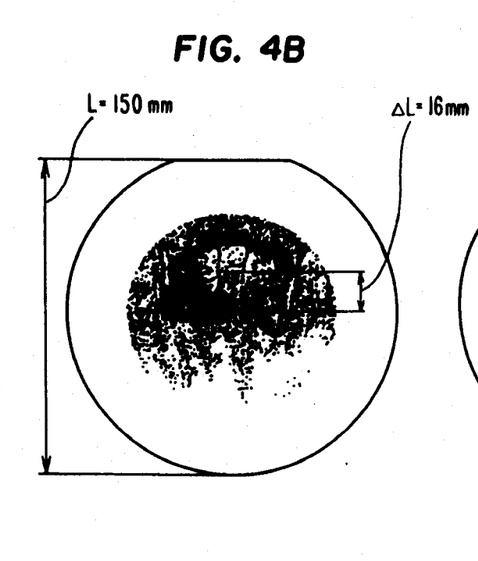
FIG. 4B shows the transfer of particles in the case where the cleaning step is conducted under the condition that a distance between substrates is 4.11 mm.
Figure 4C:
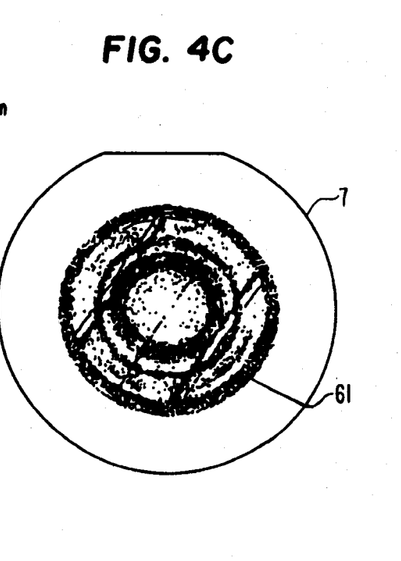
FIG. 4C shows a contamination pattern before the cleaning step.

Based on the experimental results shown in FIGS. 4A to 4C, a transfer speed (v) of the particles was calculated. The experimental results shown in FIGS. 4A to 4C were obtained by using the apparatus shown in FIGS. 1A and 1B. Two substrates 6 and 7, which were placed substantially parallel with each other, were dipped into the mixture (cleaning solution) 2 of sulfuric acid and aqueous hydrogen peroxide through the surface of the cleaning solution 2.

Before the cleaning step, the back face of the substrate 7 was contaminated with the particles 9, and the front face of the substrate 6 was not contaminated with the particles 9. The substrates 6 and 7 were dipped into the cleaning solution 2 at a dip speed (V) (200 mm/sec.) under the condition that the front face of the substrate 6 faced the back face of the substrate 7 and the orifla position 120 of the respective substrates were placed upward.

A number of particles were made to adhere to the back face of the substrate 7 as shown in FIG. 4C due to the contact with a transporting portion provided in an apparatus for producing a semiconductor device. In FIG. 4C, a black portion corresponds to a contamination pattern 61 of the particles 9. As shown in FIG. 4B, a transfer pattern in the case where the distance between substrates was 4.11 mm shifted from the contamination pattern by 16 mm in the direction opposite to the dip direction. However, no shift was observed in the horizontal direction. As shown in FIG. 4A, a transfer pattern in the case where the distance between substrates was 8.87 mm shifted more than that in FIG. 4B in the direction opposite to the dip direction. The amount of shift could not be measured.

Assuming that the time required for particles 9 on the contamination pattern 61 to be transferred by a distance (l) between the substrates is t (at this time, the particles 9 were transferred in the horizontal direction along the surface of the cleaning solution 2). During the time (t), both of the substrates 6 and 7 moved by (dip speed V)×(time t) in the dip direction. Thus, the position of the front face of the substrate 6, to which the particles 9 readhered, shifted upward (i.e., in the direction opposite to the dip direction) by (dip speed V)×(time t) from the position of the back face of the substrate 7, from which the particles 9 departed.

Assuming that the amount of shift is $\Delta L$, $\Delta L = V \times t$, and $v \times t = l$ are obtained.

Moreover, from the above-mentioned expressions, $t = \Delta L/V = l/v$ is obtained. From this expression, $v = lV/\Delta L$ is obtained.

If $l = 4.11$, $V = 200$ mm/sec., $\Delta = 16$ mm, then $v = 51$ mm/sec.

Here, a simple model in which the particles 9 were linearly transferred from the substrate 7 to the substrate 6 was shown. From the observation result that the transfer pattern shifted from the contamination pattern 61 only in the direction opposite to the dip direction, it can be considered that this model is sufficiently exact to describe the readhesion phenomenon of the particles 9.

The following expression should be satisfied in order to perform the following: Before some particles which firstly depart from a substrate are transferred along the surface of the cleaning solution to reach an adjacent substrate, the adjacent substrate is completely submerged in the cleaning solution.

$$l/v \geq L/V$$

$$(lV \geq vL)$$

where V is a speed for dipping the substrate into the cleaning solution; l is a distance between the substrates, L is a length of the substrate in the dip direction; and v is a speed at which the particles are transferred along the surface of the cleaning solution.

Figure 5:
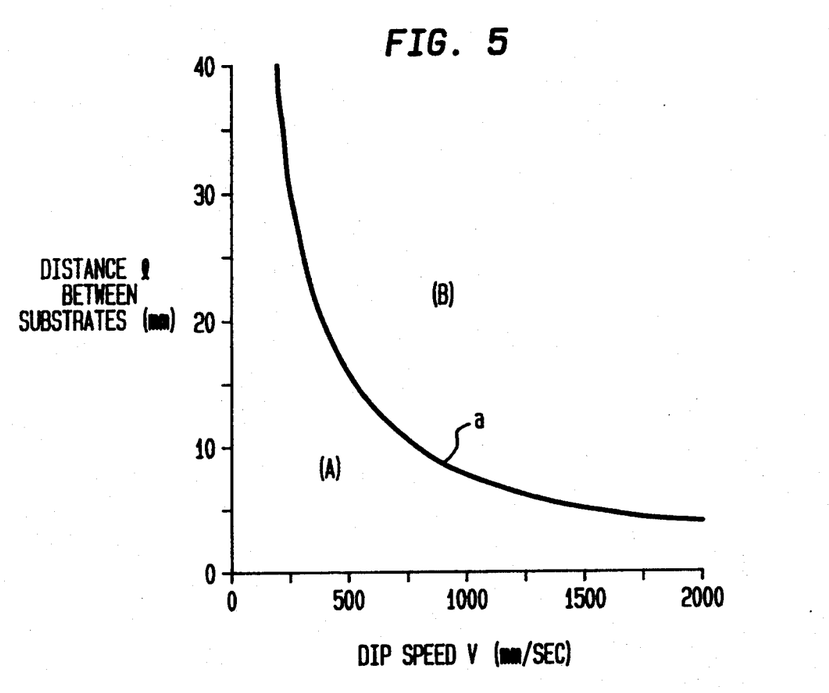
FIG. 5 is a graph showing the influence of the distance (l) between substrates and the dip speed upon the readhesion and non-adhesion.

FIG. 5 is a graph showing an example of the above-mentioned expression. As the basis of the calculation for obtaining the curve of FIG. 5, the length (L) of the substrate in the dip direction and the speed (v) at which the particles are transferred along the surface of the cleaning solution were made 150 mm and 51 mm/sec. The graph is divided into a region (A) and a region (B) by a curve a. The region (B) satisfies the above-mentioned expression. In order to satisfy the expression, for example, assuming that $v = 51$ mm/sec., $l = 4.11$ mm, and $L = 25.4$ mm, V should be set at 320 mm/sec. or more.

Figure 9:
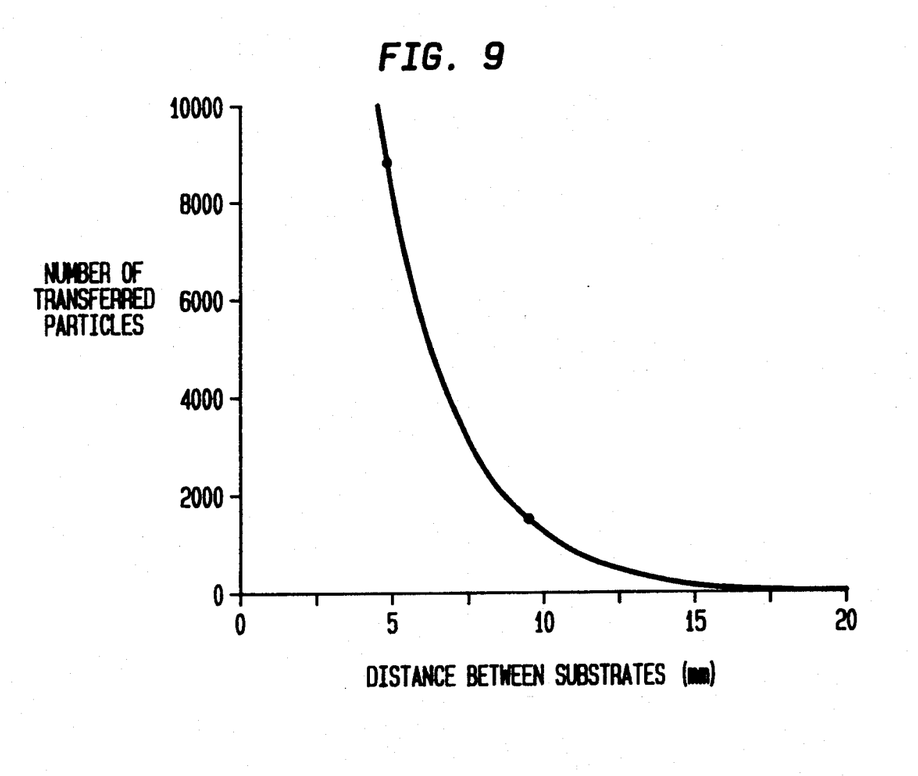
FIG. 9 is a graph showing the relationship between the number of transferred particles and the distance between substrates.

FIG. 9 shows the number of transferred particles in the case where the cleaning experiment was conducted under the condition of the region (A) of FIG. 5 (i.e. $L = 150$ mm, $V = 200$ mm/sec., $l = 4.11$ mm, and 8.87 mm, and $v = 51$ mm/sec.). As is understood from FIG. 9, as the distance (l) between the substrates became larger, the number of transferred particles decreased.

Cleaning experiments were conducted, using four kinds of substrates, on the surface of each substrate Si, $SiO_2$, High Temperature Oxide (HTO), and $Si_3N_4$ were exposed. Table 1 shows the relationship between the transfer of particles and the surface state of a substrate. Even though any one of the substrates was used, the transfer of particles was observed.

TABLE 1

| First substrate Front face film | Second substrate Back face film | Transfer |
| --- | --- | --- |
| Si | Si | X |
| SiO2 | Si | ◉ |
| HTO | Si | ○ |
| Si3N4 | Si | — |
| Si | SiO2 | X |
| SiO2 | SiO2 | X |
| HTO | SiO2 | X |
| Si3N4 | SiO2 | ○ |
| Si | HTO | — |
| SiO2 | HTO | — |
| HTO | HTO | X |
| Si3N4 | HTO | — |
| Si | Si3N4 | — |
| SiO2 | Si3N4 | ◉ |
| HTO | Si3N4 | — |
| Si3N4 | Si3N4 | ○ |

◉: Transfer pattern is recognized.
○: Transfer pattern is not clearly recognized, but a number of particles readhere to a substrate.
X: No transfer pattern is recognized.
—: Not studied.

In addition, the main component of the particles was confirmed to be silicon by EDX.

During steps such as pure water cleaning, fuming nitric acid cleaning, and fluoric acid wet etching, the transfer of particles was not observed.

Hereinafter, the present invention will be described by way of illustrating examples with reference to the drawings.

EXAMPLE 1

Figure 6:
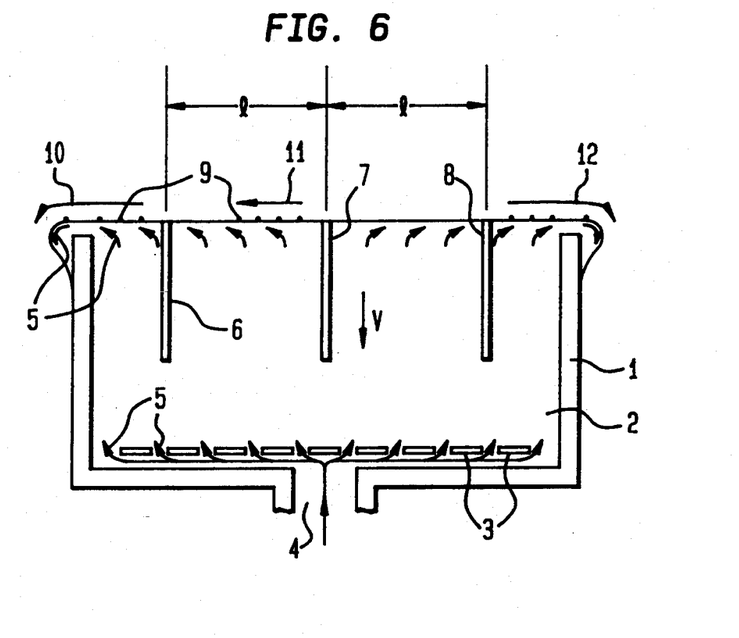
FIG. 6 is a diagram illustrating a method for cleaning a substrate according to the present invention.

As shown in FIG. 6, three semiconductor substrates 6, 7, and 8 which were placed substantially parallel with each other were dipped into a mixture (cleaning solution) 2 of sulfuric acid and aqueous hydrogen peroxide through the surface thereof. The substrates 6, 7, and 8 were dipped into the cleaning solution 2 at a dip speed (V) so that each orifla position was positioned upward. The substrates 6, 7, and 8 were simultaneously dipped into the cleaning solution 2 in a cleaning tank 1. In FIG. 6, the reference numerals 10, 11, and 12 respectively represent the movement of particles 9 which had adhered to the substrates 6, 7, and 8.

The cleaning solution 2 was accommodated in the cleaning tank 1. The size of the cleaning tank 1 used in the present example was 230 mm×240 mm×185 mm (width×length×depth). A supply port (diameter: 60 mm) 4 for the cleaning solution 2 was provided on the bottom of the cleaning tank 1. The cleaning solution 2 was supplied to the cleaning tank 1 through the supply port 4 at a flow rate of 17 litters per minute. The top of the cleaning tank 1 was open. Because of this, the cleaning solution 2 overflew the cleaning tank 1. In the lower portion of the cleaning tank 1, a rectifying plate 3 with a slit (pitch: 30 mm) was provided. Because of the rectifying plate 3, a flow 5 of the cleaning solution 2 maintained a laminar flow.

In the present example, a cleaning step was conducted under the conditions that each length (L) of the substrates 6, 7, and 8 in the dip direction was 150 mm, a particle transfer speed (v) was 51 mm/sec., a distance (l) between the substrates was 23.15 mm, and a dip speed (V) was 350 mm/sec. The dip speed (V) and the distance (l) between the substrates used in the present example satisfied the conditions of the region (B), in which no particles readhered, shown in the graph of FIG. 5.

The particles 9 departing from the back face of the substrate 7 were transferred to the adjacent substrate 6 as shown in FIG. 6. However, since the dip speed (V) and the distance (l) between the substrates satisfied the conditions of the region (B) of FIG. 5, before the particles 9 reached the front face of the substrate 6, the substrate 6 had been completely submerged in the cleaning solution 2. Because of this, the particles 9 did not readhere to the front face of the substrate 6. In addition, the particles 9 which had departed from the substrates 6 and 8 were removed by the overflow of the cleaning solution 2.

After the cleaning step of the present example was conducted, the front face of the substrate 6 was observed by the surface analyzer. As a result, only tens of particles 9 (with a particle size of 0.3 μm or more) were observed. Thus, it can be considered that the transfer of the particles did not occur.

When there are a plurality of distances between the substrates (i.e., three of more substrates are used), the minimum distance between the substrates is used as the distance (l).

In the present example, the substrates 6, 7, and 8 were dipped into the cleaning solution 2 so that the dip direction thereof was substantially vertical to the surface of the cleaning solution 2. It is also possible that the substrates 6, 7, and 8 are dipped into the cleaning solution 2 under the condition that the dip direction thereof and the surface of the cleaning solution 2 form an angle of other than 90 degrees.

EXAMPLE 2

Hereinafter, another example of the present invention will be described with reference to FIG. 7.

Figure 7:
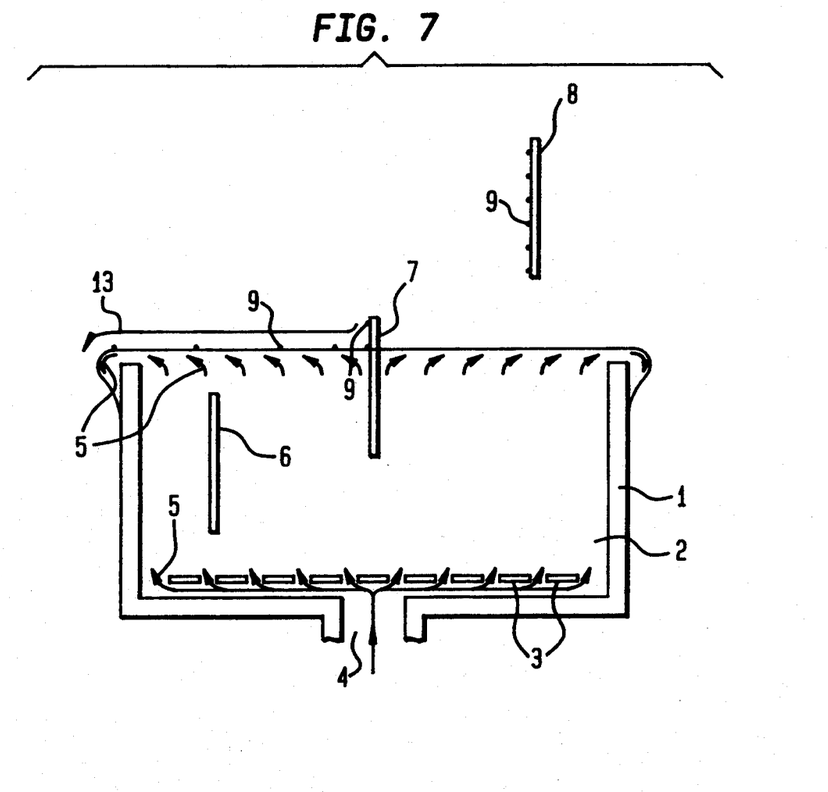
FIG. 7 is a diagram illustrating another method for cleaning a substrate according to the present invention.

As shown in FIG. 7, three semiconductor substrates 6, 7, and 8 were separately dipped into the mixture (cleaning solution) 2 of sulfuric acid and aqueous hydrogen peroxide through the surface thereof. The substrates 6, 7, and 8 were dipped into the cleaning solution 2 so that each orifla position was positioned upward. In FIG. 7, the reference numeral 13 represents the movement of particles 9 which had adhered to the substrate 7.

The cleaning solution 2 was accommodated in the cleaning tank 1. The supply port 4 for the cleaning solution 2 was provided on the bottom of the cleaning tank 1. The cleaning solution 2 was supplied to the cleaning tank 1 through the supply port 4. The top of the cleaning tank 1 was open. Because of this, the cleaning solution 2 overflew the cleaning tank 1. In the lower portion of the cleaning tank 1, the rectifying plate 3 was provided. Because of the rectifying plate 3, the flow 5 of the cleaning solution 2 maintained a laminar flow. This exemplary structure of the cleaning apparatus was the same as that of Example 1.

In the present example, the substrates 6, 7, and 8, to each of which the particles 9 adhered, were not simultaneously dipped into the cleaning solution 2. First, the substrate 6 was dipped into the cleaning solution 2. The particles 9 adhering to the back face of the substrate 6 were removed by the flow 5 of the cleaning solution 2. After the substrate 6 was completely submerged in the cleaning solution 2, the substrate 7 was dipped into the cleaning solution 2. The particles 9 adhering to the back face of the substrate 7 departed from the substrate 7 along the surface of the cleaning solution 2 and were removed from the cleaning tank 1 by the flow 5 of the cleaning solution 2. Then, after the substrate 7 was completely submerged in the cleaning solution 2, the substrate 8 was dipped into the cleaning solution 2. In this way, the substrates 6, 7, and 8 were separately dipped into the cleaning solution 2 so that two or more substrates were not present on the surface of the cleaning solution 2. Thus, the particles 9 which departed from a substrate which had previously been dipped were removed from the cleaning tank 1 to the outside by the time when a subsequent substrate was dipped into the cleaning solution 2. Because of this, the particles 9 can be prevented from readhering to a subsequent substrate to be dipped.

In the present example, the substrates 6, 7, and 8 were dipped into the cleaning solution 2 so that the dip direction thereof was vertical to the surface of the cleaning solution 2. The dip direction of the substrates 6, 7, and 8 can form any angle with respect to the surface of the cleaning solution 2.

As described above, according to the method of the present invention, if the expression: $lV \geq vL$ is satisfied, all of the substrates can be completely submerged in the cleaning solution in the vertical direction with respect to the surface of the cleaning solution before the particles departing from a substrate reach an adjacent substrate. Thus, the particles departing from a substrate are prevented from readhering to an adjacent substrate.

In addition, according to another method of the present invention, substrates are separately dipped into the cleaning solution so that two or more substrates are not exposed on the surface of the cleaning solution. Because of this, the particles which depart from the nth substrate has been removed from the cleaning solution to the outside by the time when the (n+1)th substrate is dipped into the cleaning solution. Thus, the particles departing from the nth substrate can be prevented from readhering to the (n+1)th and the subsequent substrates.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for cleaning a plurality of semiconductor wafer substrates in which the plurality of semiconductor wafer substrates are disposed substantially parallel with each other with a distance (l) between them comprising the steps of:

dipping the plurality of semi-conductor wafer substrates into a container containing cleaning solution to remove particles adhering to each of the substrates, wherein the substrates having length (L) measured in a dip direction are dipped into the cleaning solution at a first speed (V) through a surface of the cleaning solution, and transferring the particles at a second speed (v) along the surface of the cleaning solution, wherein the equation $v \leq lV/L$ is satisfied such that as the particles depart from each of the plurality of substrates and are transferred along the surface of the cleaning solution to reach an adjacent substrate, said adjacent substrate becomes completely submerged in the cleaning solution before said particles reach said adjacent substrate.

2. A method for cleaning a substrate according to claim 1, wherein the plurality of substrates are dipped into the cleaning solution so that a dip direction thereof and the surface of the cleaning solution forms a substantially right angle.

3. A method for cleaning a substrate according to claim 1, wherein a main component of the particles is silicon.

4. A method for cleaning a substrate according to claim 3, wherein the cleaning solution is a mixture containing sulfuric acid and aqueous hydrogen peroxide.

5. A method for cleaning a substrate according to claim 1, wherein the cleaning solution is accommodated in a cleaning tank having an opening on a bottom thereof, the cleaning solution is supplied to the cleaning tank through the opening, and the substrates are dipped into the cleaning solution while the cleaning solution overflows the cleaning tank.

6. A method for cleaning a plurality of semiconductor wafer substrates in which the plurality of substrates are dipped into a cleaning solution to remove particles adhering to each of the substrates, wherein the cleaning solution is a mixture which transfers the particles at a speed along the surface of the cleaning solution, and wherein the substrates are separately, sequentially dipped into the cleaning solution so that neither of any two adjacent substrates among the plurality of substrates, which two adjacent substrates are spaced a fixed distance apart, are not simultaneously exposed to the surface of the cleaning solution for a sufficient time required for particles removed from one of said adjacent substrate to travel the fixed distance therebetween.

7. A method for cleaning a substrate according to claim 6, wherein the cleaning solution is accommodated in a cleaning tank having an opening on a bottom thereof, the cleaning solution is supplied to the cleaning tank through the opening, and the substrates are dipped into the cleaning solution while the cleaning solution overflows the cleaning tank.

* * * * *